(12) United States Patent
Li

(10) Patent No.: US 9,318,718 B2
(45) Date of Patent: Apr. 19, 2016

(54) METHODS AND DEVICES FOR SILICON INTEGRATED VERTICALLY ALIGNED FIELD EFFECT TRANSISTORS

(71) Applicant: King Abdullah University of Science and Technology, Thuwal (SA)

(72) Inventor: Jingqi Li, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 14/710,904

(22) Filed: May 13, 2015

(65) Prior Publication Data

US 2015/0333282 A1    Nov. 19, 2015

Related U.S. Application Data

(60) Provisional application No. 61/992,356, filed on May 13, 2014.

(51) Int. Cl.
*H01L 29/06* (2006.01)
*H01L 51/05* (2006.01)
*H01L 51/10* (2006.01)
*H01L 51/00* (2006.01)

(52) U.S. Cl.
CPC .......... *H01L 51/057* (2013.01); *H01L 51/0558* (2013.01); *H01L 51/10* (2013.01); *H01L 51/105* (2013.01); *H01L 51/0048* (2013.01); *H01L 2251/301* (2013.01)

(58) Field of Classification Search
CPC ... H01L 51/057; H01L 51/0558; H01L 51/10; H01L 51/105
USPC .......................................................... 257/12
See application file for complete search history.

(56) References Cited

U.S. PATENT DOCUMENTS

2009/0166686 A1*    7/2009    Hunt et al. ..................... 257/288

OTHER PUBLICATIONS

Li, Jingqi, et al. "Vertically aligned carbon nanotube field-effect transistors" Carbon, 50:4628-4632 (2012).

* cited by examiner

*Primary Examiner* — Douglas Menz
(74) *Attorney, Agent, or Firm* — Thomas Horstemeyer, LLP

(57) ABSTRACT

Embodiments of the present disclosure provide for vertically aligned CNTFET, methods of making vertically aligned CNTFET, methods of using vertically aligned CNTFET, and the like.

19 Claims, 10 Drawing Sheets

METHODS AND DEVICES FOR SILICON INTEGRATED VERTICALLY ALIGNED FIELD EFFECT TRANSISTORS

CLAIM OF PRIORITY TO RELATED APPLICATION

This application claims priority to co-pending U.S. provisional application entitled "METHODS AND DEVICES FOR SILICON INTEGRATED VERTICALLY ALIGNED FIELD EFFECT TRANSISTORS" having Ser. No. 61/992,356, filed on May 13, 2014, which is entirely incorporated herein by reference.

BACKGROUND

Single-walled carbon nanotubes (SWCNTs) have many uses due to their unique characteristics. One such characteristic is that SWCNTs have a relatively high mobility. In this regard, SWCNTS may be compatible with field effect transistor (FET) architectures.

SUMMARY

Embodiments of the present disclosure provide for vertically aligned canbon nanotube field effect transistors (CNTFET), methods of making vertically aligned CNTFET, methods of using vertically aligned CNTFET, and the like An embodiment of the present disclosure includes an apparatus, among others, that includes: a stack, a single-walled carbon nanotube, a gate dielectric, and a gate electrode. In an embodiment, the stack includes a source layer comprising silicon; a drain layer comprising a metal contact; and a dielectric layer disposed in between the source layer and the drain layer. In an embodiment, the source layer, the dielectric layer, and the drain layer are stacked in a vertical alignment. The single-walled carbon nanotube can be positioned adjacent to a sidewall of the stack. At least a portion of the single-walled carbon nanotube can be coupled to the source layer and at least another portion of the single-walled carbon nanotube coupled to the drain layer. The gate dielectric can be positioned adjacent to the single-walled carbon nanotube. The gate electrode can be positioned adjacent to the gate dielectric. In an embodiment, the apparatus can have a transfer characteristic depending at least in part upon a polarity of a drain to source voltage and a silicon doping type of the source layer.

An embodiment of the present disclosure includes a method, among others, that includes: forming a source layer on a substrate, the source layer comprising silicon; forming a dielectric layer on the source layer; forming a drain layer on the dielectric layer, the drain layer being a metal contact, wherein the source layer, the dielectric layer, and the drain layer are vertically aligned; forming a single-walled carbon nanotube on a side wall of individual ones of the source layer, the dielectric layer, and the drain layer, at least a portion of the single-walled carbon nanotube coupled to the source layer, and at least another portion of the single-walled carbon nanotube coupled to the drain layer; forming a gate dielectric layer adjacent to the single-walled carbon nanotube; and forming a gate electrode adjacent to the gate dielectric layer, wherein a transfer characteristic depends at least in part upon a polarity of a drain to source voltage and a silicon doping type of the source layer.

An embodiment of the present disclosure includes an apparatus, among others, that includes: a source layer comprising silicon; a drain layer; a dielectric layer disposed in between the source layer and the drain layer; wherein the source layer, the dielectric layer, and the drain layer are vertically aligned; a single-walled carbon nanotube adjacent to a sidewall of the source layer, the dielectric layer, and the drain layer, at least a portion of the single-walled carbon nanotube coupled to the source layer, and at least another portion of the single-walled carbon nanotube coupled to the drain layer; a gate dielectric adjacent to the single-walled carbon nanotube; and a gate electrode adjacent to the gate dielectric, wherein a n-type source layer exhibits ambipolar transfer characteristics when a positive drain to source voltage is applied to the drain layer and a p-type source layer exhibits ambipolar transfer characteristics when a negative drain to source voltage is applied to the drain layer.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure.

DETAILED DESCRIPTION

Figure 1:
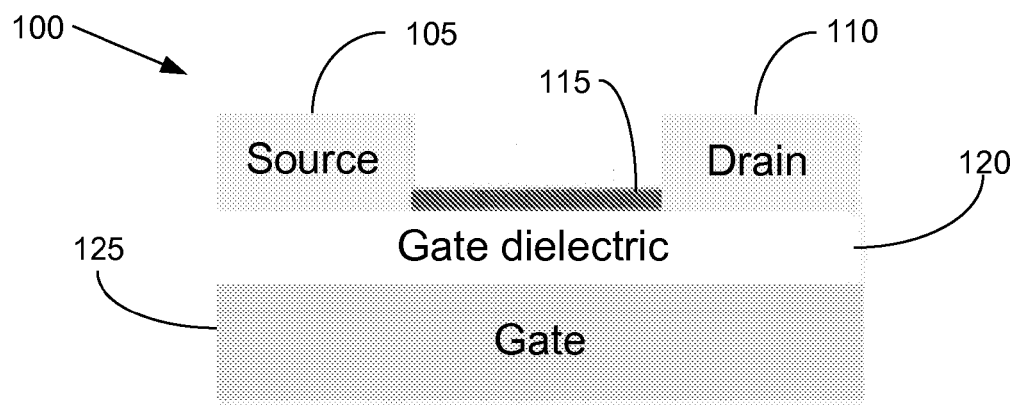
FIG. 1 is a drawing of a carbon nanotube field-effect transistor (CNTFET) according to various embodiments of the present disclosure.

Embodiments of the present disclosure provide for vertically aligned CNTFET, methods of making vertically aligned CNTFET, methods of using vertically aligned CNTFET, and the like.

Embodiments of the present disclosure are directed towards a vertically aligned CNTFET that uses silicon (Si) as a source and a metal contact as a drain. The vertically aligned CNTFET may exhibit transfer characteristics based on the polarity of a drain to source voltage and a Si doping of the source.

Single-walled carbon nanotubes (SWCNTs) may be a one-dimensional and mono-atomic layer material. SWCNTs may have shown carrier mobility as high as 100000 cm²/Vs,[1] and may be compatible with field effect transistor (FET) architecture and high-k insulators.[2] SWCNTs may be alternative materials for Si in microelectronics.[3] The sub-2 nm diameter of the SWCNT may satisfy the body thickness requirement for a 5 nm node FET. The use of Si technology may reduce mobility by several folds due to the enhanced surface scattering and device variations.[4,5] Recently developed CNTFETs with single SWCNT and sub-10 nm channel length have exhibited unexpected switching behavior.[6] The switching behavior may be comparable to advanced Si devices. Particularly, the normalized current density, about 2.41 mA/μm, shown at a low operating voltage of 0.5 V, may be more than four times better than the more advanced Si devices.

Challenges for large scale transistor fabrication may include 100% separation of semiconducting SWCNTs (s-SWCNTs) from metallic SWCNTs, control of s-SWCNT chirality and diameter, and precise assembly of SWCNTs into the transistor position.[7] In contrast, si may be considered a mature field of technology that may have been developed very successfully over the last four decades. The combination of Si technology and carbon nanotubes may be an approach to exploit the advantages of both Si and SWCNT. The combining of Si and graphene may produce an improved graphene barrister.[8]

In general, embodiments of the present disclosure provide for an apparatus that includes a stack, a single-walled carbon nanotube, a gate dielectric, and a gate electrode. In an embodiment, the stack includes a source layer comprising silicon; a drain layer comprising a metal contact; and a dielectric layer disposed in between the source layer and the drain layer. In an embodiment, the source layer, the dielectric layer, and the drain layer are stacked in a vertical alignment.

The single-walled carbon nanotube can be positioned adjacent to a sidewall of the stack. At least a portion of the single-walled carbon nanotube can be coupled to the source layer and at least another portion of the single-walled carbon nanotube coupled to the drain layer. The gate dielectric can be positioned adjacent to the single-walled carbon nanotube. The gate electrode can be positioned adjacent to the gate dielectric.

The transfer characteristic can depend at least in part upon a polarity of a drain to source voltage and a silicon doping type of the source layer. In an embodiment, the transfer characteristic for a n-type source layer can be ambipolar when a positive drain to source voltage is applied to the drain layer. In an embodiment, the transfer characteristic for a p-type source layer can be ambipolar when a negative drain to source voltage is applied to the drain layer. In an embodiment, the transfer characteristic for a n-type source layer can be n-type when a negative drain to source voltage is applied to the drain layer. In an embodiment, the transfer characteristic for a p-type source layer can be p-type when a positive drain to source voltage is applied to the drain layer.

The integration of SWCNTs and Si using vertical CNTFETs, as described in various embodiments of the present disclosure, Si may be used as one contact of the transistor while another metal contact may be vertically stacked above the silicon. There may be a dielectric layer between the top metal contact and the lower Si contact. SWCNTs may be placed on the vertical side wall of the stack. Therefore, the vertical CNTFET described in various embodiments of the present disclosure may allow for the integration of Si and SWCNTs without changing the present Si technology. Moreover, fabrication of the vertical short channel CNTFETs may be facilitated because the channel length of the SWCNT may be the same thickness as the dielectric layer, and the thickness may be precisely controlled. Channel lengths of about 1 μm to sub-10 nm may be determined without using those prohibitively expensive techniques, such as electron beam lithography. Furthermore, integration density may be increased because the CNTFETs may be vertically aligned.

According to various embodiments, the vertical metal-oxide-semiconductor field effect transistors (MOSFETs) occupy smaller space than their planar counterparts.[9] The increase in integration density may be attractive for active-matrix organic light-emitting diode (AMOLED) drivers in display technology. The aperture ratio of the AMOLED pixel may be significantly increased by decreasing the transistor area.

FIG. 1 is a drawing of a CNTFET according to various embodiments of the present disclosure. Particularly, FIG. 1 is a schematic of a planar CNTFET 100. The planar CNTFET 100 may comprise a source 105, a drain 110, at least one nanotube 115, a gate dielectric 120, a gate electrode 125, and/or potentially other components. The planar CNTFET 100 may comprise two identical metal contacts as the source 105 and the drain 110, respectively. The nanotube 115 may be a SWCNT. The CNTFET 100 may exhibit the same transfer characteristics at both positive and negative drain to source voltages ($V_d$). That is to say, the CNTFET 100 may exhibit the same transfer characteristics regardless of the polarity of the $V_d$.

Figure 2:
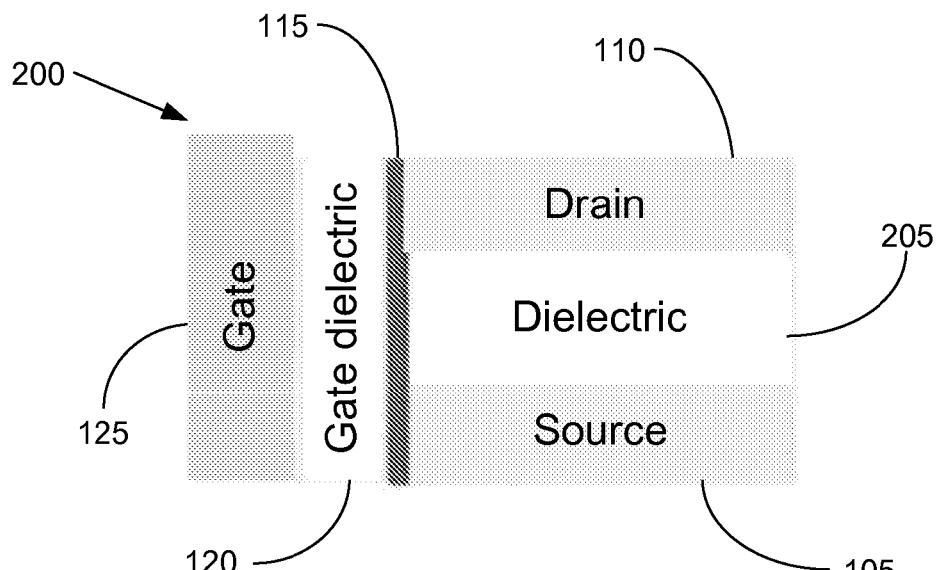
FIG. 2 is a drawing of a vertical CNTFET according to various embodiments of the present disclosure.

FIG. 2 is a drawing of an embodiment of a vertical CNTFET 200 according to various embodiments of the present disclosure. The vertical CNTFET 200 may comprise a source 105, drain 110 comprising a metal contact, and a dielectric 205 disposed in between the source 105 and the drain 110. The source 105, the dielectric 205, the drain 110, and potentially other components may be vertically aligned with respect to one another. That is to say, the dielectric 205 may be disposed on top of the source 105 and the drain 110 may be disposed on top of the dielectric 205. The vertical CNTFET 200 may further comprise a nanotube 115 adjacent to a sidewall of the vertical stack. The nanotube 115 may be a SWCNT. At least a portion of the nanotube 115 may be coupled to the source 105 and at least another portion of the nanotube 115 may be coupled to the drain 110. A gate dielectric 120 may be disposed adjacent to the nanotube 115. A gate electrode 125 may be disposed adjacent to the gate dielectric 120. Further discussion regarding the vertical CNTFET 200 is provided in Carbon 50 (2012), 4628-4632 (Vertically aligned carbon nanotube field-effect transistors).

In addition, the performance of the Si integrated CNTFET 200 may be different than the performance of CNTFETs that have two metal contacts. Particularly, the transfer characteristics of the CNTFETs 200 may depend on both of the polarity $V_d$, the Si type, and/or other factors.

Figure 3:
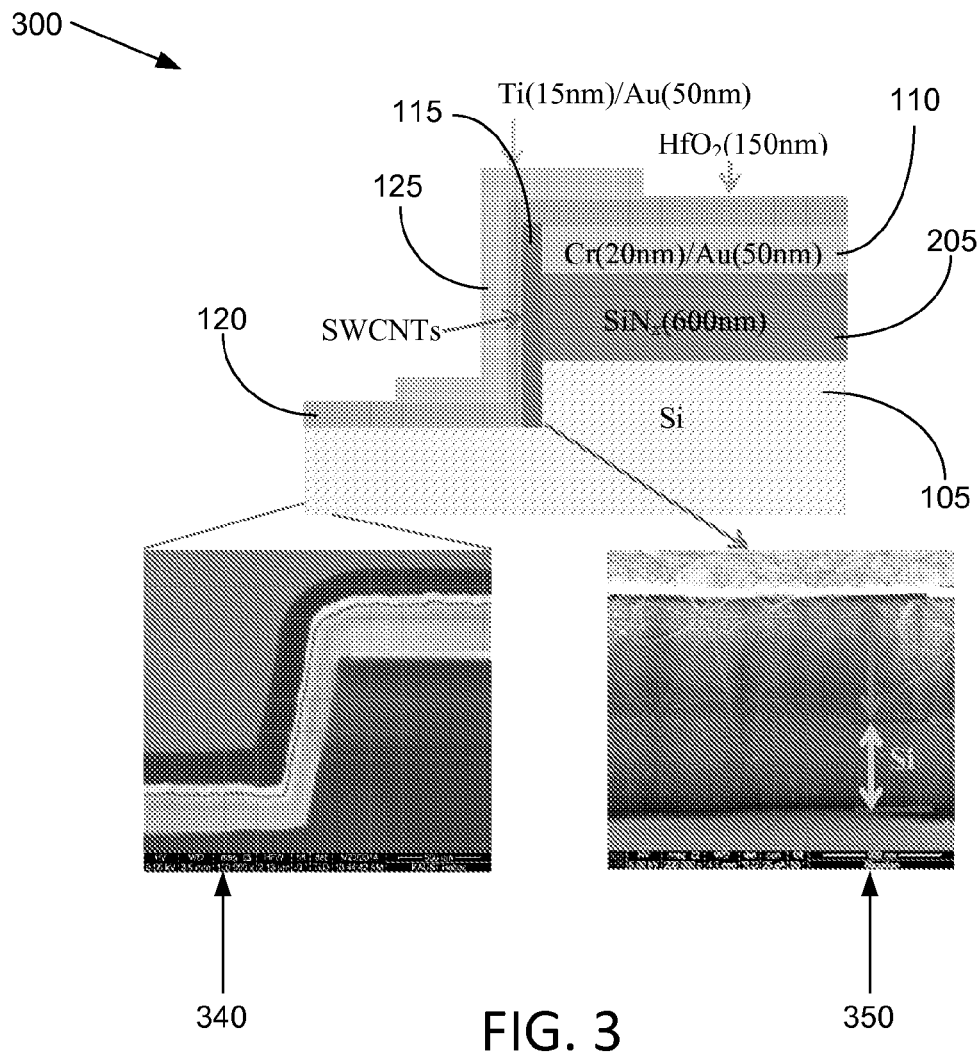
FIG. 3 is a drawing with photos showing another vertical CNTFET according to various embodiments of the present disclosure.

FIG. 3 is a drawing with photos showing another example of the vertical CNTFET 200, herein referred to as vertical CNTFET 300. The CNTFET 300 may also comprise a source 105, a drain 110, a dielectric 205, at least one nanotube 115, a gate dielectric 120, a gate electrode 125, and/or other components. The source 105 may comprise Si or other material that functions consistent with the teachings of the present disclosure. The drain 110 may comprise about 20-nm of Chromium (Cr) and about 50-nm of Gold (Au), or other material(s) that functions consistent with the teachings of the present disclosure. The dielectric 205 may comprise about 600-nm of silicon nitride ($SiN_x$ (x=1 or 2)) or other material that functions consistent with the teachings of the present disclosure. The nanotube 115 may be a SWCNT or a multi-wall carbon nanotube. The gate dielectric 120 may comprise 50-nm of Hafnium(IV) oxide ($HfO_2$) or other material that functions consistent with the teachings of the present disclosure. The gate electrode may comprise 15 nm Titanium (Ti) and 50 nm-Au or other material that functions consistent with the teachings of the present disclosure.

As non-limiting examples, the vertical CNTFET 300 may be fabricated as follows. First, Si wafers may be cleaned using buffered oxide etch (BOE) to remove the thin natural oxide layer on the Si surface. Then, a $SiN_x$ film with a thickness of about 600 nm may be deposited on the Si using plasma enhanced chemical vapor deposition (PECVD). Silane ($SiH_4$) (about 23 sccm), ammonia ($NH_3$) (about 20 sccm) and nitrogen ($N_2$) (about 980 sccm) may be used as reaction gases with deposition pressure of about 850 mTorr. The forward power and substrate temperature may be about 20 W and about 300° C., respectively. After the $SiN_x$ deposition, the metal contact, composed of about 20-nm Cr and about 50-nm Au, may be fabricated using electron beam evaporation (Denton, base pressure about $4 \times 10^{-6}$ Torr) and lithography. The $SiN_x$ outside the CNTFETs 300 may be etched using reactive ion etching (RIE). The fluoroform ($CHF_3$) flow, sulfur hexafluoride ($SF_6$) flow and chamber pressure may be about 90 sccm, about 10 sccm and about 10 mTorr, respectively, in the etch process. SWCNTs may be placed on the side wall of the vertical stack by dropping SWCNT aqueous surfactant solution (Nanointegris, IsoNanotubes-S, semiconductor purity 99%) onto the Si wafer and evaporating the solution at about 200° C. To eliminate the surfactant contamination, the wafer may be baked at about 250° C. for about half an hour. Before the deposition of the gate dielectric layer, the SWCNTs beyond the transistor channels may be etched using RIE to isolate the CNTFETs from each other. The power, pressure, oxygen flow and etch time may be about 150 W, about 50 mTorr, about 30 sccm and about 1 min, respectively. The SWCNTs on the side wall of the vertical stack is shown in the SEM image 350 of FIG. 3. The SWCNTs on the side wall of the vertical stack form carbon nanotube networks and may bridge the top Cr/Au contact and bottom Si.

The gate dielectric 120 may be constructed of two layers of $HfO_2$. In the first step, about 90 nm of $HfO_2$ may be deposited by electron beam evaporation. This layer may protect the SWCNTs from being etched from ozone used in the subsequent deposition. After evaporation, the sample may be transferred into the atomic layer deposition (ALD) chamber for the deposition of the second layer $HfO_2$, which may be of relatively high quality and excellent step coverage for the trench like structure. The ALD $HfO_2$ (about 60 nm) may be deposited at about 200° C. using a commercial ALD system (Cambridge Nanotech, Savannah100). The precursor, tetrakis (dimethylamido)hafnium and ozone may be used in the deposition.

The gate electrode 125, that may comprise about 15 nm-Ti and about 50 nm-Au, may be subsequently deposited using electron beam evaporation and lithography. Finally, the source 105 and drain 110 contacts may be exposed by etching the gate dielectric layer on top of the contacts using BOE. A SEM image 340 shows the typical transistor cross-section.

Figure 4A:
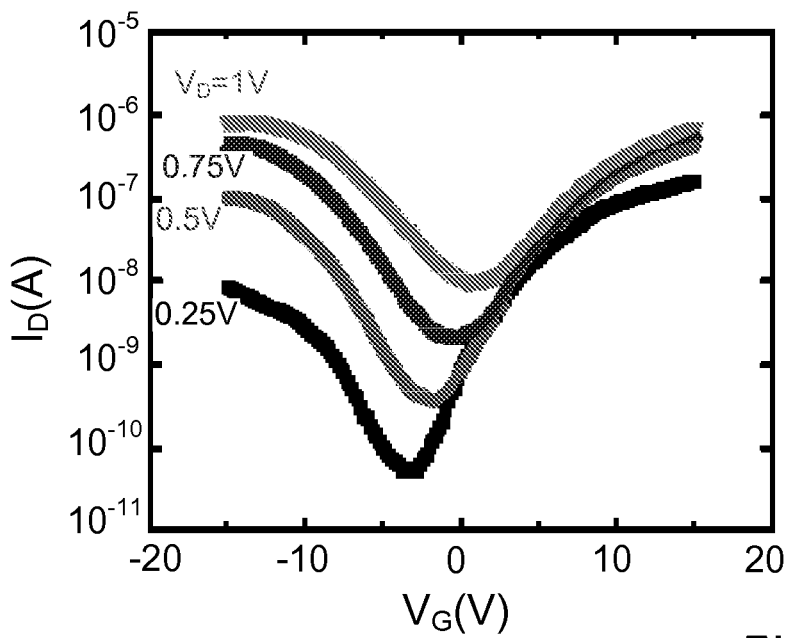
FIGS. 4A-B, 5A-B, and 6A-B are graphs showing transfer characteristics of the vertical CNTFET of FIG. 3 according to various embodiments of the present disclosure.
Figure 4B:
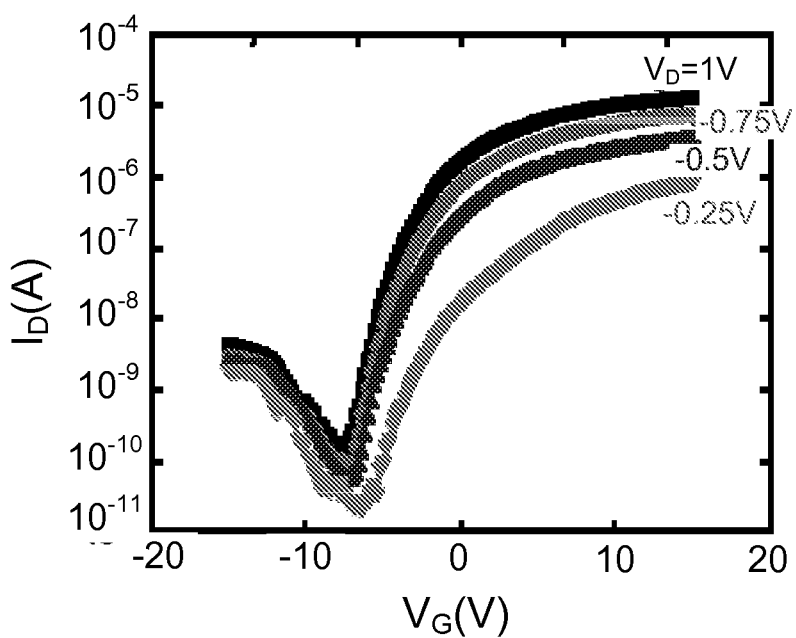

FIGS. 4A and 4B are graphs showing transfer characteristics of the vertical CNTFET 300 of FIG. 3 according to various embodiments of the present disclosure. For example, FIGS. 4A and 4B are graphs showing transfer characteristics of the vertical CNTFETs using n-type Si (n-Si) wafer. For example, the doping level may be $5.0 \times 10^{17}$ cm$^{-3}$-$1.0 \times 10^{18}$ cm$^{-3}$. The variation from samples may be less than one order of magnitude. The metal contact and Si substrate may used as the drain 110 (FIG. 3) and source 105 (FIG. 3) of the CNTFET 300, respectively. The vertical CNTFET 300 may exhibit ambipolar characteristics, as shown in FIG. 4A, if a large positive drain to source voltage, $V_d \geq 0.5$ V, is applied to the metal contact (Cr/Au). The current, $I_d$, may decrease first with increasing the gate voltage, $V_G$, from −15 V and may reach a minimum point. Then, it may increase with increasing the gate voltage to 15 V. This may indicate that the Fermi level of the contact lies approximately in the middle of the SWCNT energy band gap.[10] As a result, electrons and holes may contribute to n-branch current at positive $V_G$ and p-branch current at negative $V_G$, respectively. The minimum points corresponding to different $V_d$ may shift to the right side with increasing $V_d$, as further described below.

The p-branch current may be slightly larger than n-branch current for $V_d$=1 V. As $V_d$ decreases, the p-branch current may gradually become lower than the n-branch current. The ambipolar characteristics of the CNTFET 300 may turn to n-type characteristics at negative $V_d$, as shown in FIG. 4B. The n-branch current may be more than 3 orders of magnitude larger than the p-branch current. In contrast, traditional CNT-FETs 300 fabricated with two identical metal contacts may have presented the same characteristics (ambipolar or unipolar) at both positive and negative $V_d$. Further description regarding various embodiments of CNTFETs 300 is provided below.

The mobility of the vertical CNTFETs 300 may be calculated using $$\mu = \frac{dI_d}{dV_g} \times \frac{L}{C \times W \times V_d} \quad \text{(equation 1)}$$

where L and W are the channel length and width, respectively. C may be the capacitance per unit area between the gate and the nanotube network. To take into consideration of the electrostatic coupling between carbon nanotubes 115, the capacitance may be expressed as[11]

$$C = \left\{ \frac{1}{2\pi\varepsilon_{ox}\varepsilon_0} \ln\left[ \frac{2\Lambda_0}{d} \frac{\sinh(2\pi t_{ox}/\Lambda_0)}{\pi} + C_Q^{-1} \right] \right\}^{-1} \Lambda_0^{-1} \quad \text{(equation 2)}$$

where $t_{ox}$, $\Lambda_0^{-1}$, and $C_Q$ are gate dielectric thickness, carbon nanotube density and quantum capacitance, respectively. The transconductance of the CNTFET 300 may be in the range of approximately 0.9~2.5 μS. Using L=600 nm, W=2 μm, $C_Q$=4×10$^{-10}$ F/cm$^2$, $\Lambda_0^{-1}$=5 tubes/μm, d=1.4 nm, $t_{ox}$=150 nm and $\varepsilon_{ox}$=14 for mixed $HfO_2$, the mobility may be in the range of approximately 11~32 cm$^2$/V·s. These results may be comparable to the values reported using other techiques,[12,13] and may be higher than values obtained from planar CNTFETs. The increase in values may be due to the fact that some SWCNTs may bridge the source 105 and the drain 110 directly in the vertical CNTFETs 300 due to a short channel. In that regard, the channel resistance between SWCNTs in the vertical CNTFET 300 may be relatively less than a channel resistance in the long-channel planar CNTFETs, which may lead to a higher mobility for vertical CNTFETs 300. Thus, increasing the SWCNT density may further improve the mobility.[14] Particularly, decreasing the oxide thickness and reducing the contact resistance by using an appropriate metal may improve the mobility.[15]

Figure 5A:
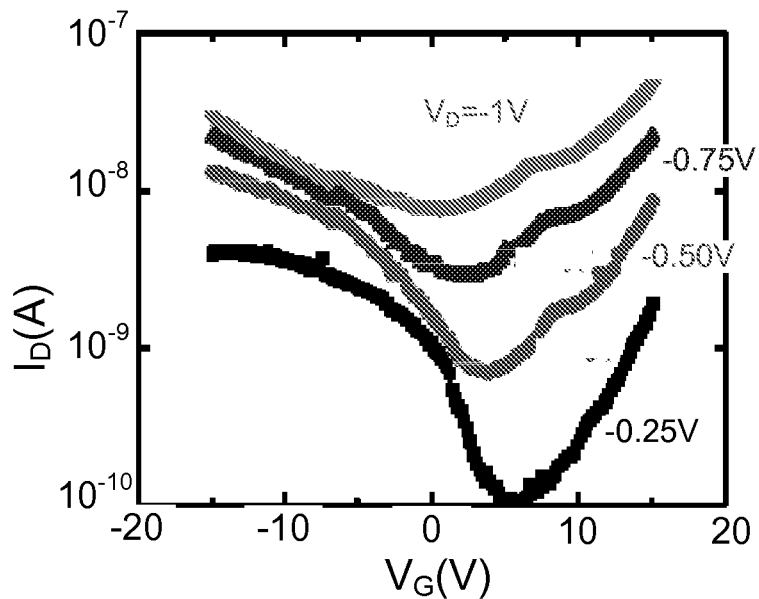
Figure 5B:
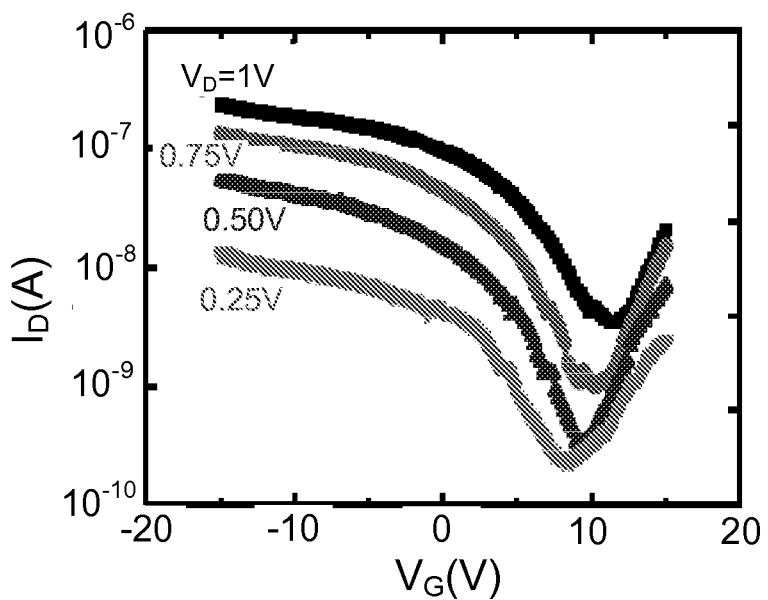

FIGS. 5A and 5B are graphs showing transfer characteristics of the vertical CNTFET 300 of FIG. 3 according to various embodiments of the present disclosure. For example, FIGS. 5A and 5B are graphs showing transfer characteristics of the vertical CNTFET 300 using p-type Si (p-Si) wafer. The vertical CNTFET 300 using p-type Si (p-Si) wafer may also exhibit ambipolar characteristics as shown in FIG. 5A, but at negative $V_d$, in contrast to those CNTFET 300 with n-Si. The ambipolar characteristics may change to p-type characteristics, as shown in FIG. 5B, instead of n-type ones, as shown in FIG. 4B, for the CNTFETs 300 with n-Si after reversing the polarity of $V_d$. The metal contact and Si substrate may be similarly used as the drain 110 (FIG. 1) and source 105 (FIG. 1), respectively, in the measurement.

Experiments may use the semiclassical method to simulate performance of these vertical CNTFET 300.[16-19] Since the gate overlapped part of the Si contact in experiment and the conductance of this part was also modified by the gate voltage, the channel may be composed of a SWCNT and part of Si. Two metal contacts may be used as source 105 and drain 110 of the CNTFET 300 in the calculation. For short channel CNTFETs, the contact resistance may play a relatively more significant role than the channel resistance in the transistor performance.[4] The neglect of channel resistance may cause the simulation current to be somewhat higher than that of actual transistors. Supposing the carrier transport in SWCNT and the Si channel is ballistic, the current is given by the Landauer-Büttiker formula.

$$I = \frac{4e}{h} \int [F(E) - F(E + eV_d)] T(E) dE, \quad \text{(equation 3)}$$

where $V_d$ is the drain voltage, $F(E)$ is the Fermi function and $T(E)$ is the energy-dependent transmission through the SB between the SWCNT/Si and electrodes. $T(E)$ can be estimated using the Wentzel-Kramers-Brillouin (WKB) approximation $$T(E) = \exp\left[-2 \int_{z_1}^{z_2} k(z) dz\right], \quad \text{(equation 4)}$$

with the wave number $$k(z) = \frac{2}{3aV_0} \left\{ \left(\frac{E_g}{2}\right)^2 - [E + eV(z)]^2 \right\}^{1/2}, \quad \text{(equation 5)}$$

where a=0.144 nm, $E_g$=0.6 eV, and $V_0$=2.5 eV are the C—C bond length, the SWCNT band gap and the tight-binding parameter, respectively. $V(z)$ is the electrostatic potential along the channel and may be obtained by numerically solving the Laplace equation. The integration is performed between the two classical turning points, $z_1$ and $z_2$.[16] The temperature considered here may be about 300 K. The Fermi level, $E_F$, of the source 105 and drain 110 contacts may be assumed to be at the middle of the SWCNT band gap. It may locate at about 0.3 eV and about 0.8 eV below the conduction band of n-Si and p-Si, respectively, for a Si band gap of about 1.1 eV.

Figure 6A:
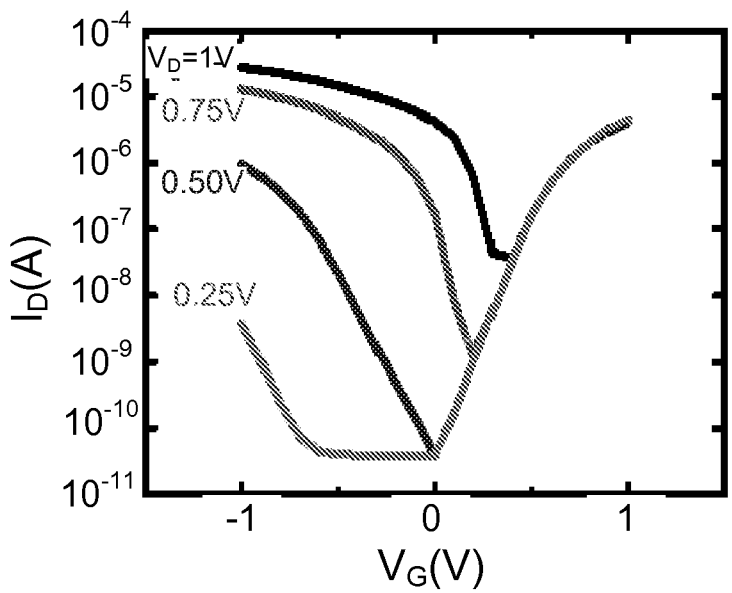
Figure 6B:
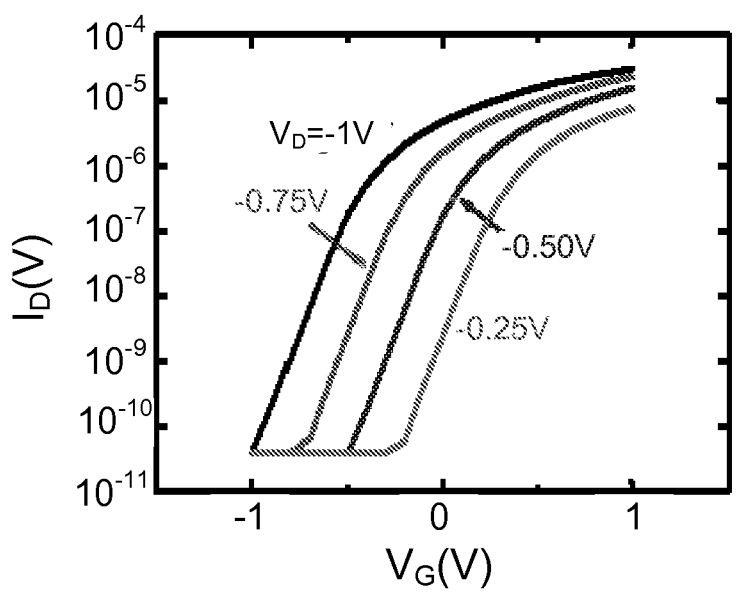

FIGS. 6A and 6B are graphs showing transfer characteristics of the vertical CNTFET 300 of FIG. 3 according to various embodiments of the present disclosure. Particularly, FIGS. 6A and 6B are graphs showing transfer characteristics of the vertical CNTFET 300 using a n-type Si (n-Si) wafer. The CNTFET 300 shows ambipolar characteristics at a relatively large positive $V_d$, as shown in FIG. 6A, and n-type characteristics at negative $V_d$, as shown in FIG. 6B, being consistent with the experimental results.

Figure 7A:
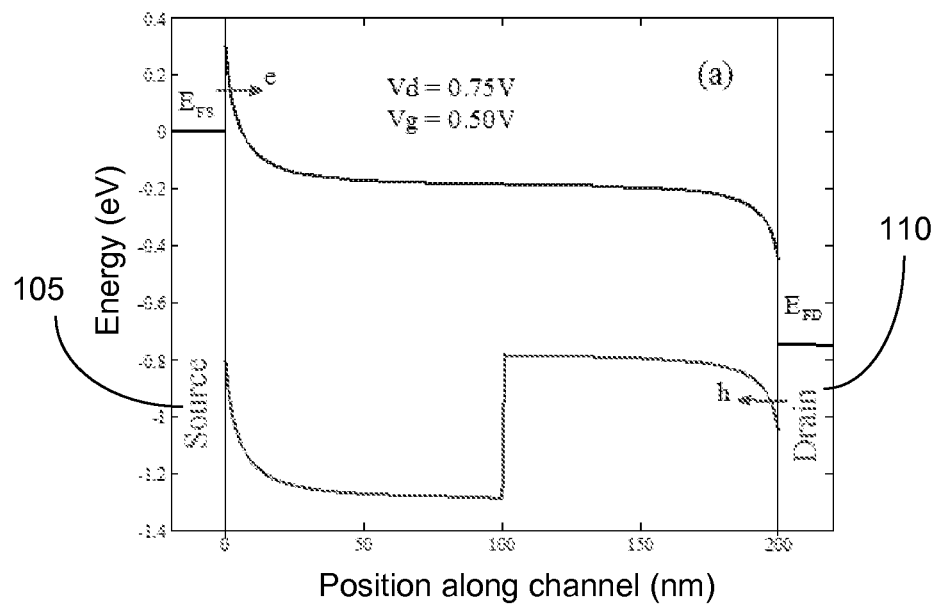
FIGS. 7A-B and 8A-B show energy band diagrams of the vertical CNTFET of FIG. 3 according to various embodiments of the present disclosure.
Figure 7B:
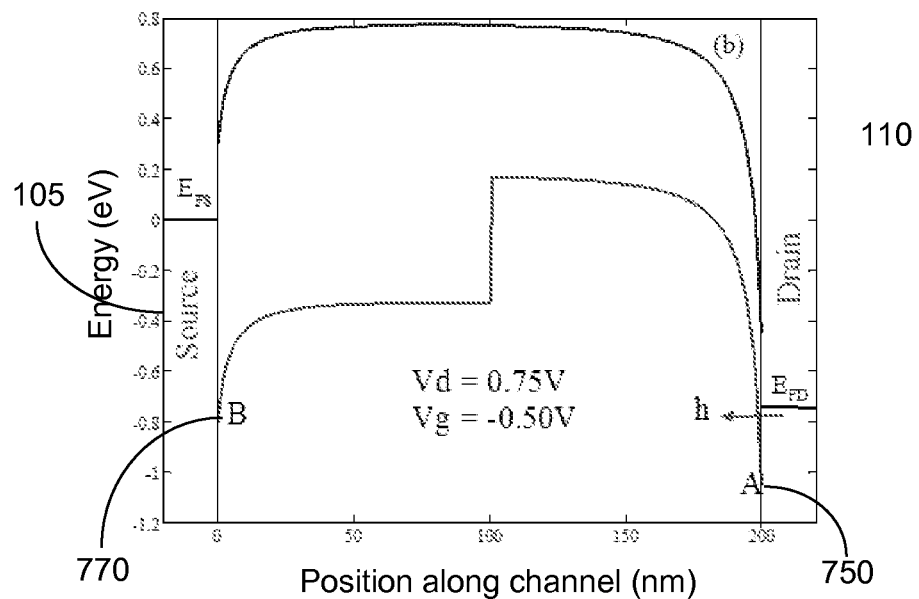

FIGS. 7A and 7B show energy band diagrams of an embodiment of the vertical CNTFET 300 of FIG. 3 according to various embodiments of the present disclosure. Particularly, FIGS. 7A and 7B show energy band diagrams of the vertical CNTFET 300 using a n-type Si (n-Si) wafer with a positive $V_d$ after application of a positive and negative $V_G$, respectively. First, consider the band change and the transfer characteristics at a relatively large positive bias ($V_d \geq 0.5$ V). If a positive $V_G$ is simultaneously applied, the center of the channel band may move downward relative to that at about $V_G$=0 V, the Schottky barrier (SB) between source 105 and Si for electron at the source 105 may become thinner with increasing $V_G$, as shown in FIG. 7A. Electrons from the source 105 may tunnel through this SB into the channel and reach the drain 110 to form electron current. At the drain 110, the SWCNT band may bend downwards at $V_d$>0 V, the hole injection from drain 110 may be possible, but the injected holes may be blocked by the large forbidden band of Si at the source 105. Therefore, the electron current generated from the source 105 may play a critical role for the n-branch current at $V_d$>0 V and $V_G$>0 V. At negative $V_G$, the center band of the channel shifts upwards, as shown in FIG. 7B, and may block the above mentioned electron current. However, on the one hand, the upshift of the center band may result in a sufficiently thin SB for holes at the source 105, making holes injected from drain 110 tunneling through it possible. On the other hand, the downward bending of the SWCNT band at the drain 110 due to large positive $V_d$ that may cause the sharp point of the hole SB at the drain 110 (point 750 in FIG. 7B) is lower than that of the SB at the source 105 (point 770 in FIG. 7B), the holes may reach the source 105 without energy barrier. Therefore, the hole current from drain 110 may contribute to the p-branch current of the ambipolar characteristics while the electron current is suppressed at $V_G$<0 V. Since the band energy between the Fermi level and the conduction band of n-Si may be about 0.3 eV, which is equal to that between the Fermi level and the valence band of the SWCNT, the electron current from the source 105 at positive $V_G$ may be comparable to the hole current from the drain 110 at the corresponding negative $V_G$. As a result, the n-branch current may be in the same order of magnitude as the p-branch current, leading to the ambipolar characteristics. The n-branch current and p-branch current may increase monotonically with $V_G$ and $V_d - V_G$, respectively.[9] Therefore, the minimum current may happen at $V_G = \frac{1}{2} V_d$, and it may shift to right side with the increasing of $V_d$, being consistent with the experimental observation in FIGS. 4A and 4B. If $V_d$ is not large enough, say about $V_d$=0.25 V, the SB for holes at the drain 110 may be higher than the SB at the source 105, both hole energy and transmission probability may be greatly reduced and the hole current may be relatively much less than that at a relatively higher positive $V_d$. Consequently, the CNTFET 300 may present n-type characteristics at small positive $V_d$, being in agreement with the experimental result as shown in FIG. 4A.

Figure 8A:
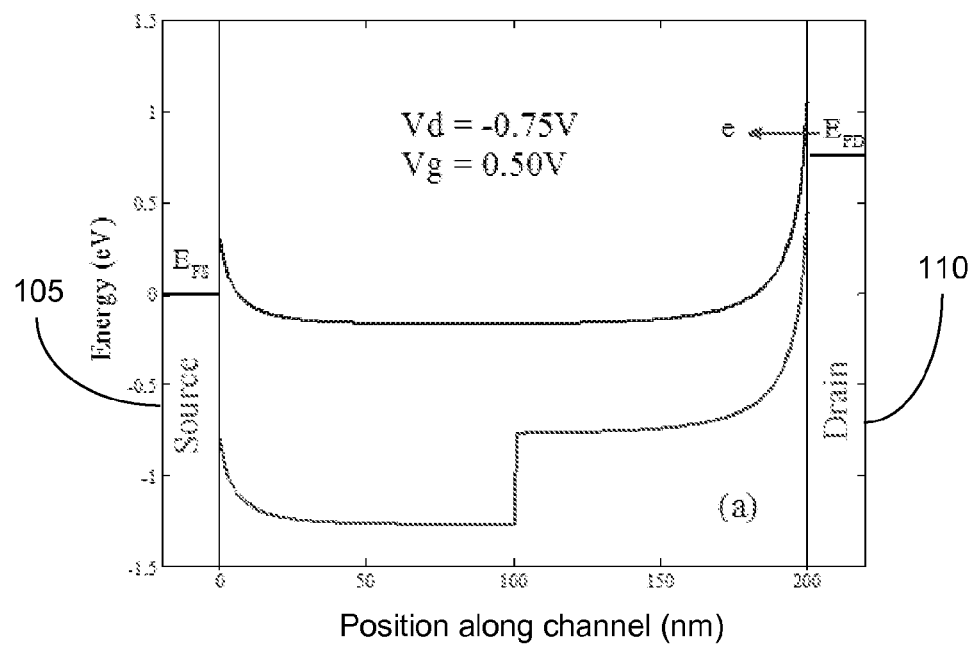
Figure 8B:
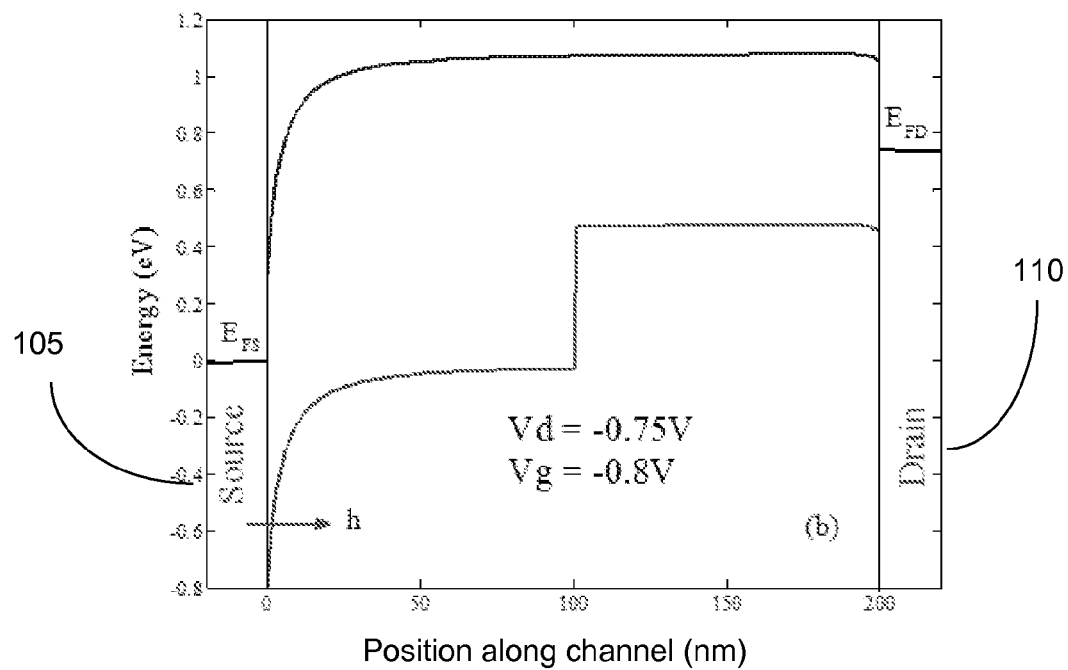

FIGS. 8A and 8B show energy band diagrams of the vertical CNTFET 300 of FIG. 3 according to various embodiments of the present disclosure. Particularly, FIGS. 8A and 8B show energy band diagrams of the vertical CNTFET 300 using a n-type Si (n-Si) wafer with a negative $V_d$ after application of a positive and negative $V_G$, respectively. At a negative $V_d$ the SWCNT band at the drain 110 may bend upwards. At $V_G$>0 V, the center of the channel band moves downwards, as shown in FIG. 8A. The electron SB at the drain 110 may be thin enough for electrons tunneling through it and being collected by the source 105, contributing to n-branch current. As $V_G$ increases, the channel band may shift lower and the SB may become more transparent, the electron current from the drain 110 may increase with increasing $V_G$. In contrast, the hole transport from source 105 to drain 110 may be blocked by the large forbidden band of n-Si. The thermionic emission of holes over the valence band may be in the order of about $1\times10^{-17}$ A, which may be much less than the electron current from the drain 110. Therefore, the electron injection from drain 110 to source 105 may dominate the n-branch current at $V_G>0$ V. For $V_G<0$ V, the center band of the channel may move upwards as shown in FIG. 8B, building large barrier for electron transport from drain 110 to source 105. The electron current, therefore, may be much less than that at $V_G>0$ V. At a smaller $V_G$, for example, $V_G=-1$ V, the electron current is mainly from thermionic emission of electrons over the barrier. Since the electron current may be small, the total current at this situation may depend, to a large extent, on the hole transport from source 105 to drain 110. However, the hole current may also be negligible although the hole SB between the source 105 and n-Si may become relatively thinner due to the upward movement of the center band. This is because the density of holes at energies around the sharp SB may be very small due to the large forbidden band of n-Si, or the large energy distance from the sharp SB point to the Fermi level of the n-Si. The calculated hole current from source 105 to drain 110 may be less than the electron current from thermionic emission at drain 110. As a result, the total current at about $V_G=-1$ V may be about five orders of magnitude less than the current at $V_G=1$ V, leading to the n-type characteristics of the CNTFET 300 at $V_d<0$ V. This calculation results explains the experimental observation in FIG. 4B.

Figure 9:
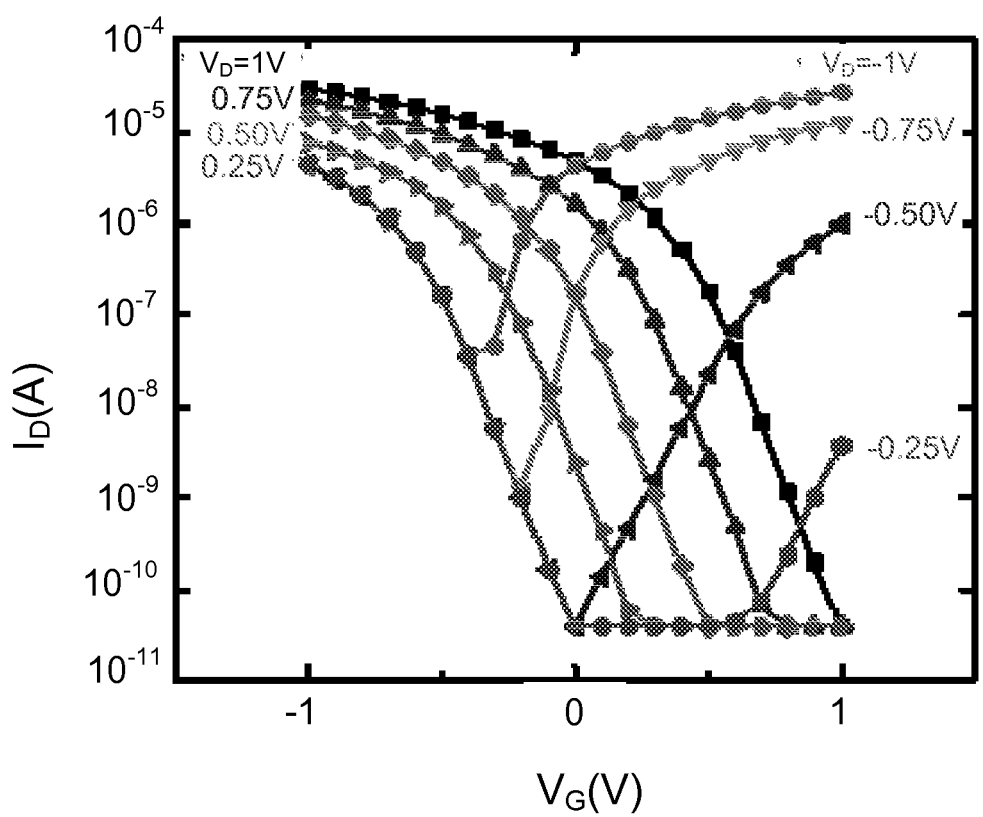
FIG. 9 is graph showing the transfer characteristics of the vertical CNTFET of FIG. 3 according to various embodiments of the present disclosure.

FIG. 9 is graph showing the transfer characteristics of the vertical CNTFET 300 of FIG. 3 according to various embodiments of the present disclosure. Particularly, FIG. 9 is a graph showing transfer characteristics of the vertical CNTFET using a p-Si wafer. In the case of p-type Si being used in the simulation, the calculated results may exhibit ambipolar and p-type characteristics at $V_d<0$ V and $V_d>0$ V, respectively, as shown in FIG. 7, similar to the graph shown in FIG. 5. The ambipolar characteristics at $V_d<0$ V may be because both hole tunneling (p-branch current) from the source 105 (FIG. 1) to drain 110 (FIG. 1) at $V_G<0$ V and electron tunneling (n-branch current) from drain 110 to source 105 at $V_G>0$ V are possible. In addition, their corresponding SBs may have the similar height and width, leading to comparable n-branch current and p-branch current. On the contrary, there may be only hole injection (p-branch current) from drain 110 to source 105 at $V_G<0$ V and $V_d>0$ V. The electron transport from source 105 to drain 110 at $V_G>0$ V and $V_d>0$ V may be prohibited by the large band gap of p-Si. Consequently, the CNTFET 300 may exhibit p-type characteristics at $V_d>0$ V.

Figure 10A:
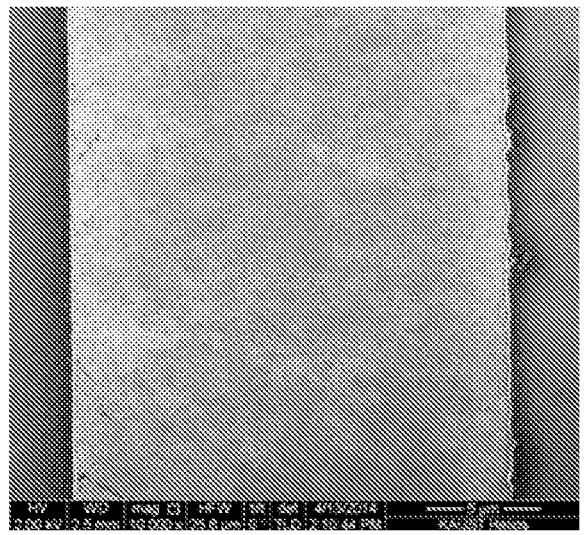
FIGS. 10A and 10B Illustrate SEM images of a planar CNTFET before deposition of $HfO_2$ and gate (10A) and the SWCNT network in the channel (10B).
Figure 10B:
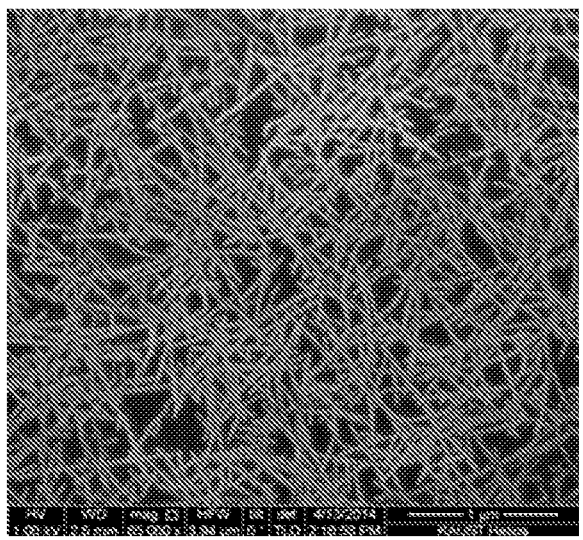

Fabrication of planar CNTFETs: The top-gated planar CNTFETs have been fabricated on a silicon wafer which was thermally coated with a 500 nm thick $SiO_2$ layer. First, the source and drain contacts composed of 10-nm Ti and 50-nm Au were fabricated using electron beam evaporation (Denton, base pressure $4\times10^{-6}$ Torr) and lithography. Then, SWCNTs were placed on top of $SiO_2$ by dropping SWCNT aqueous surfactant solution (Nanointegris, IsoNanotubes-S, semiconductor purity 99%) onto the Si wafer and evaporated the solution at 200° C. To eliminate the surfactant contamination, the wafer was baked at 250° C. for 0.5 hr. FIGS. 10A and 10B show the SEM images of the channel and the SWCNTs in the channel. The SWCNT density is 10~15 tubes/μm. Before the deposition of the gate dielectric layer, The SWCNTs beyond the transistor channels were etched using RIE to isolate the CNTFETs from each other. The power, pressure, oxygen flow and etch time were 150 W, 50 mTorr, 30 sccm and 1 min, respectively. The channel length and width are 20 μm and 160 μm, respectively.

The gate dielectrics were of two layers of $HfO_2$, including 60 nm of electron beam evaporated $HfO_2$ and 30 nm of ALD $HfO_2$. After the gate dielectric deposition, the top gate electrode, 15 nm—Ti and 50 nm—Au, was subsequently deposited using electron beam evaporation and lithography. Finally, the source and drain contacts were exposed by etching the gate dielectric layer on top of the contacts using BOE.

Figure 11:
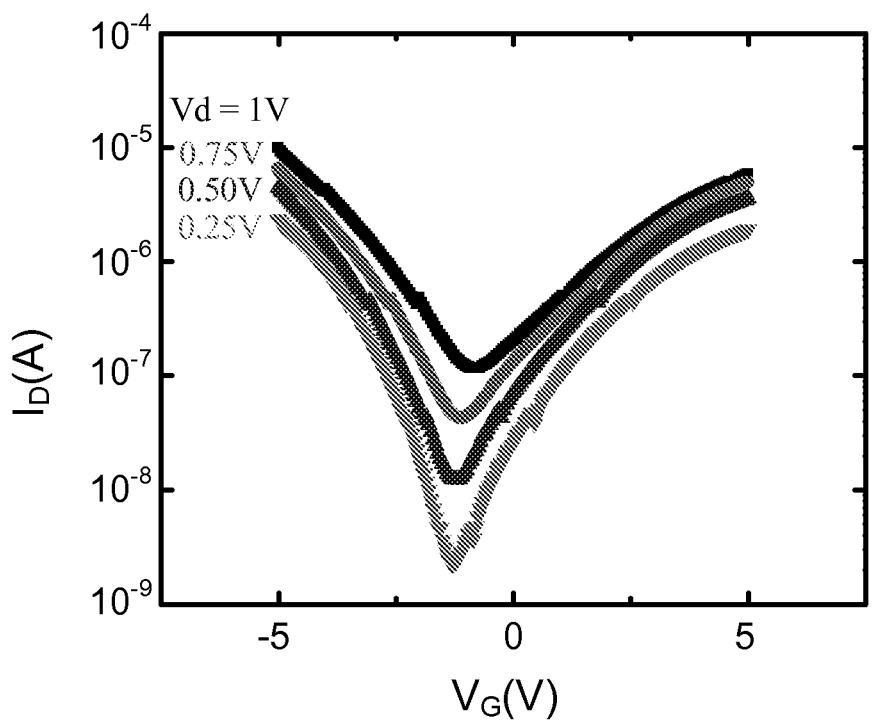
FIG. 11 is a graph that illustrates the transfer characteristics of the planar CNTFETs at positive drain voltage. The black (top), red (second from top), blue (second from bottom) and purple curves (bottom) are for $V_d$=1 V, 0.75 V, 0.5 V and 0.25 V, respectively.
Figure 12:
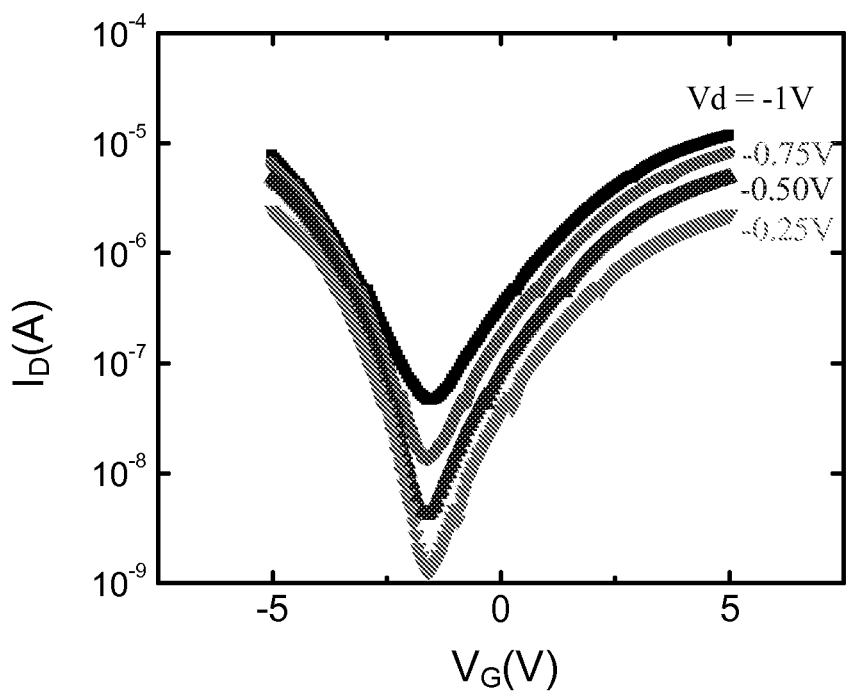
FIG. 12 is a graph that illustrates transfer characteristics of the planar CNTFETs at negative drain voltages. The black (top), red (second from top), blue (second from bottom) and purple (bottom) curves are for $V_d$=−1 V, −0.75 V, −0.5 V and −0.25 V, respectively.

Characterization of the planar CNTFETs: The transfer characteristics of the planar CNTFETs are shown in FIG. 11 and FIG. 12 for positive and negative $V_d$, respectively. It can be seen clearly that the planar CNTFETs exhibit ambipolar characteristics at any drain voltages, i.e., the transfer characteristics do not depend on the sign of the drain voltage. The transconductance of the planar CNTFETs is in the range of 1.7~6 μS. Using L=20 μm, W=160 μm, $C_Q=4\times10^{-10}$ F/m, $\Lambda_0^{-1}=10$~15 tubes/μm, d=1.4 nm, $t_{ox}=90$ nm and $\in_{ox}=14$ for mixed $HfO_2$, the mobility extracted from these CNTFETs using equation (1) and (2) is in the range of 5.9~15 $cm^2/V \cdot s$.

The present disclosure is directed to vertically aligned CNTFETs using both p-Si and n-Si. The Si substrate and Cr/Au may be used as the source 105 and drain 110 of the CNTFETs 300, respectively. The SWCNTs may be placed on the sidewall of the vertical stack of Si/dielectrics/metal contact to bridge source 105 and drain 110. The sub-1 μm channel may be defined by the thickness of the dielectric layer, offering a simple method to fabricate short channel CNTFET 300. The CNTFET 300 may show ambipolar characteristics at positive and negative $V_d$ for n-Si and p-Si source 105 contact, respectively. If the $V_d$ polarity is reversed, the CNTFETs 300 may present n-type/p-type characteristics depending on the n-type/p-type Si used in the fabrication. By taking Si as part of the channel, a semiclassical method may be used to simulate the CNTFETs. The different behaviors of these CNTFETs 300 may be understood through analyzing the band diagrams of the Si and SWCNT in the channel, as shown in FIGS. 7 and 8. The development of vertical CNTFETs 300 may integrate SWCNT and Si and make it possible for a large density fabrication of CNTFETs 300 due to reduced contact area and channel area compared to planar CNTFETs.

REFERENCE LIST

A. Dürkop, S. A. Getty, E. Cobas, M. S. Fuhrer, *Nano Lett.*, 2004, 4, 35-39.
Q. Cao, J. A. Rogers, *Adv. Mater.* 2009, 21, 29-53.
Ph. Avouris, *Phys Today*, 2009, 62, 34-40.
Q. Cao and S.-J. Han, *Nanoscale*, 2013, 5, 8852-8863.
M. Ieong, B. Doris, J. Kedzierski, K. Rim and M. Yang, *Science*, 2004, 306, 2057-2060.
A. D. Franklin, M. Luisier, S.-J. Han, G. Tulevski, C. M. Breslin, L. Gignac, M. S. Lundstrom and W. Haensch, *Nano lett.*, 2012, 12, 758-762.
M. F. L. DeVoider, S. H. Tawfick, R. H. Baughman, A. J. Hart, *Science*, 2013, 339, 535-539.
H. Yang, J. Heo, S. Park, H. J. Song, D. H. Sea, K.-E. Byun, P. Kim, I. Yoo, H.-J. Chung, K. Kim, *Science*, 2012, 336, 1140-1143
J. Mores, *Appl. Phys. A*, 2007, 87, 531-537.
M. Radosavljević, S. Heinze, J. Tersoff and Ph. Avouris, *Appl. Phys. Lett.*, 2003, 83, 2435-2437.
Q. Cao, S.-J. Han, G. S. Tulevski, Y. Zhu, D. D. Lu and W. Haensch, *Nature nanotech.*, 2013, 8, 180-186.
N. Rouhi, D. Jain, K. Zand, and P. J. Burke, *Adv. Mater.*, 2011, 23, 94-99.

M. Engel, J. P. Small, M. Steiner, M. Freitag, A. A. Green, M. C. Hersam, and Ph. Avouris, *ACS NANO,* 2008, 2, 2445-2452.

Q. Cao, S.-J. Han, G. S. Tulevski, Y. Zhu, D. D. Lu and W. Haensch, *Nature Nanotech.,* 2013, 8, 180-186.

S.-J. Choi, P. Bennett, K. Takei, C. Wang, C. C. Lo, A. Javey and J. Bokor, *ACS nano,* 2013, 7, 798-803.

S. Heinze, M. Radosavljević, J. Tersoff and Ph. Avouris, *Phys. Rev. B,* 2003, 68, 235418.

S. Heinze, J. Tersoff and Ph. Avouris, *Appl. Phys. Lett.,* 2003, 83, 5038-5040.

J. Li, Q. Zhang, M. Chan-Park, *Carbon,* 2006, 44, 3087-3090.

J. Li, Y. C. Cheng, Z. B. Guo, Z. H. Wang, Z. Y. Zhu, Q. Zhang, M. B. Chan-Park, U. Schwingenschlögl, X. X. Zhang, *Nanoscale,* 2013, 5, 2476-2481.

Therefore, at least the following is claimed:

1. An apparatus comprising:
    a vertical stack including:
        a first electrode comprising silicon,
        a drain electrode comprising a first drain layer consisting of chromium and a second drain layer consisting of gold; and
        a dielectric layer consisting of $SiN_x$, wherein X=1 or 2, wherein the dielectric layer is disposed in between the source electrode and the first drain layer, and wherein the dielectric layer contacts the first drain layer;
    a single-walled carbon nanotube adjacent to a sidewall of the stack, wherein at least a portion of the single-walled carbon nanotube is coupled to the source electrode and at least another portion of the single-walled carbon nanotube is coupled to the drain electrode;
    a gate dielectric adjacent to the single-walled carbon nanotube, wherein the gate dielectric comprises a first gate dielectric layer and a second gate dielectric layer; and
    a gate electrode adjacent to the gate dielectric, wherein the gate electrode comprises a first gate electrode layer comprising titanium and a second gate electrode layer comprising gold.

2. The apparatus of claim 1, wherein the drain electrode has a thickness of about 70 nm.

3. The apparatus of claim 1, wherein the source electrode has a thickness of about 600 nm.

4. The apparatus of claim 1, wherein the gate dielectric has a thickness of about 150 nm.

5. The apparatus of claim 1, wherein each gate dielectric layer consists of $HfO_2$.

6. The apparatus of claim 1, wherein the silicon is a n-type Si wafer.

7. The apparatus of claim 1, wherein the silicon is a p-type Si wafer.

8. A method comprising:
    applying a drain to source voltage ($V_d$) to the apparatus of claim 1.

9. The method of claim 8, wherein $V_d$ is positive.

10. The method of claim 8, wherein $V_d$ is negative.

11. The method of claim 8, wherein the drain to source voltage is greater than or equal to 0.5 V.

12. The method of claim 8, further comprising applying a gate voltage to the apparatus of claim 1.

13. The method of claim 10, wherein the gate voltage is positive.

14. The method of claim 10, wherein the gate voltage is negative.

15. A method comprising:
    forming a source electrode on a substrate, the source electrode comprising silicon;
    forming a dielectric layer on the source electrode the dielectric layer consisting of $SiN_x$, wherein X=1 or 2;
    forming a drain electrode on the dielectric layer, wherein forming the drain electrode comprises disposing a first drain layer consisting of chromium on the dielectric layer and disposing a second drain layer consisting of gold on the first drain layer;
    vertically aligning the source electrode, the dielectric layer, and the drain electrode;
    forming a single-walled carbon nanotube on a side wall of individual ones of the source electrode, the dielectric layer, and the drain electrode such that at least a portion of the single-walled carbon nanotube is coupled to the source electrode and at least another portion of the single-walled carbon nanotube coupled to the drain electrode;
    forming a gate dielectric layer adjacent to the single-walled carbon nanotube, wherein forming the gate dielectric layer comprises depositing a first dielectric layer comprising a metal oxide via electron beam evaporation on the single-walled carbon nanotube and depositing a second dielectric layer comprising a metal oxide via atomic layer deposition on the first dielectric layer; and
    forming a gate electrode adjacent to the gate dielectric layer, wherein forming the gate electrode comprises depositing a first gate electrode layer comprising of titanium on the gate dielectric layer and depositing a second gate electrode layer comprising gold on the first gate electrode layer.

16. The method of claim 15, wherein the drain electrode has a thickness of about 70 nm.

17. The method of claim 15, wherein the source electrode has a thickness of about 600 nm.

18. The method of claim 15, wherein the gate dielectric has a thickness of about 150 nm.

19. The method of claim 15, wherein each gate dielectric layer consists of $HfO_2$.

* * * * *